(12) United States Patent
He et al.

(10) Patent No.: US 10,971,427 B2
(45) Date of Patent: Apr. 6, 2021

(54) HEATSINK FOR INFORMATION HANDLING SYSTEM

(71) Applicant: Dell Products L.P., Round Rock, TX (US)

(72) Inventors: Qinghong He, Austin, TX (US); Edward Davis Geist, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/267,118

(22) Filed: Feb. 4, 2019

(65) Prior Publication Data

US 2020/0251404 A1 Aug. 6, 2020

(51) Int. Cl.
*H01L 23/40* (2006.01)
*F28F 27/00* (2006.01)

(52) U.S. Cl.
CPC .......... *H01L 23/4006* (2013.01); *F28F 27/00* (2013.01); *H01L 2023/4056* (2013.01); *H01L 2023/4062* (2013.01); *H01L 2023/4081* (2013.01); *H01L 2023/4087* (2013.01)

(58) Field of Classification Search
CPC ..... H01L 2303/4056; H01L 2303/4068; H01L 2303/4087; H01L 2303/4062; H01L 2303/4081; H01L 23/4006; H01L 23/4338; H01L 23/3675
See application file for complete search history.

(56) References Cited

U.S. PATENT DOCUMENTS

| | | | | |
|---|---|---|---|---|
| 4,639,829 A * | 1/1987 | Ostergren | ........... | H01L 23/4006 165/185 |
| 5,918,469 A * | 7/1999 | Cardella | ............ | H05K 7/20254 165/80.3 |
| 5,944,093 A * | 8/1999 | Viswanath | .......... | F28D 15/0241 165/104.26 |
| 6,322,247 B1 * | 11/2001 | Bonne | ................... | G01F 1/6842 374/138 |
| 2001/0052376 A1 * | 12/2001 | Damie | .................... | C22C 38/00 148/540 |
| 2006/0285297 A1 * | 12/2006 | Conner | ............... | H01L 23/4006 361/710 |

(Continued)

OTHER PUBLICATIONS

Dynatron, Model No. K785, New Product Spec Sheet, Jan. 14, 2019.

*Primary Examiner* — Wael M Fahmy
*Assistant Examiner* — Sarah K Salerno
(74) *Attorney, Agent, or Firm* — Norton Rose Fulbright US LLP

(57) ABSTRACT

Thermal coupling with between an electrical component, such as a CPU, and a heatsink can be provided by a movable heatsink insert separate from the heatsink. This movable heatsink insert can be placed on the electrical component. The heatsink can be thermally coupled to that additional thermal conductor. The heatsink, which is attached to the printed circuit board, is not in direct contact with the electrical component, reducing the likelihood that the heatsink could cause bending of the printed circuit board by pressing down on the electrical component. Further, a spring coupled between the heatsink and the movable heatsink insert can provide further pressure relief such that the heatsink assembly can be attached to an electrical component without applying excessive force to the electrical component.

15 Claims, 6 Drawing Sheets

(56) References Cited

U.S. PATENT DOCUMENTS

2007/0256810 A1* 11/2007 Di Stefano ........... H01L 23/473
165/46
2009/0116197 A1* 5/2009 Funakoshi .......... H01L 23/4334
361/719

* cited by examiner

HEATSINK FOR INFORMATION HANDLING SYSTEM

FIELD OF THE DISCLOSURE

The instant disclosure relates to information handling systems. More specifically, portions of this disclosure relate to cooling systems for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Electrical components in information handling systems generate heat that must be dissipated to prevent erratic behavior in and damage to the electrical components. The heat is often dissipated using heatsinks attached to the electrical components. Heatsinks provide a thermal conductor that transfers heat from the electrical component to a thermal conductor with a larger surface area to allow for quicker transfer of the heat to the surrounding environment. An example heatsink on a central processing unit (CPU) is shown in FIG. 1. A heatsink 120 is attached to a printed circuit board (PCB) 110 and is in thermal contact with CPU 130 through a thermal conductor 140. However, the manufacturing precision for placing the heatsink 120 in the z-dimension are not perfect. As a result, placing the heatsink 120 at an appropriate z-level to make good thermal contact with the CPU 130 without applying too much force to the PCB 110 is a challenge. When the z-placement of the heatsink 120 is incorrect, two possible results are shown in FIG. 2 and FIG. 3. FIG. 2 shows a z-placement for the heatsink 120 too high off the PCB 110. When the z-placement is too high, the heatsink 120 does not make good thermal contact with the CPU 130. A gap 200 between the CPU 110 and the heatsink 120 results in no heat transfer from the CPU 130 to the heatsink 120 and eventually to overheating of the CPU 130. FIG. 3 shows a z-placement for the heatsink 120 too low on the PCB 110. The PCB 110 may be bent 300 when the heatsink 120 is forced down on the CPU 110. The bending 300 of the PCB 110 may cause the PCB 110 to break immediately, may weaken the PCB 110 to cause a later break, and/or may cause breaks in electrical conductors within the PCB 110.

One conventional solution to reduce manufacturing problems with the low precision for z-placement of the heatsink 120 is shown in FIG. 4. A thermal pad 400 may be placed between the CPU 130 and the heatsink 120. The thermal pad 400 is thick enough, such as greater than 1 millimeter thicker than a nominal gap between the heatsink 120 and the CPU 110 in one example, such that there is no gap if z-placement of the heatsink 120 is too high off the PCB 110. The thermal pad 400 prevents a low z-placement of the heatsink 120 from bending the PCB 110. However, the thermal pad 400 has a large thermal resistance and greatly reduces heat dissipation from the CPU 130, causing early throttling or the need of a much larger heatsink to counter the performance degradation due to the thick thermal pad. The thickness of the thermal pad is particularly prohibitive in small form factor devices, such as mobile phones, tables, laptop computers, and Internet of Things (IoT) devices. Consumer demand for these devices is continuing to push smaller profiles that are difficult to obtain when a thick thermal pad is needed to compensate for z-placement manufacturing tolerances.

Shortcomings mentioned here are only representative and are included simply to highlight that a need exists for improved thermal performance in small form factor devices, such as internet of things (IoT) devices. Embodiments described herein address certain shortcomings but not necessarily each and every one described here or known in the art. Furthermore, embodiments described herein may present other benefits than, and be used in other applications than, those of the shortcomings described above.

SUMMARY

Embodiments of the invention described herein moderate the need for high precision z-placement of the heatsink on the electrical components. Conventionally, thermal contact between a heatsink and electrical component is made along the z-dimension, which can be represented by a vector normal to a plane defined by the printed circuit board on which the electrical component is mounted. The reduced requirements on z-placement may be obtained by using an additional thermal conductor separate from the heatsink. This additional thermal conductor, also referred to as a movable heatsink insert, can be placed on the electrical component and the heatsink and thermally coupled to that additional thermal conductor. Thermal coupling between the additional thermal conductor and the heatsink can be made by injecting a thermal fluid into a gap between the additional thermal conductor and the heatsink. The heatsink, which is attached to the printed circuit board, may not be in direct contact with the electrical component, reducing the likelihood that the heatsink could cause bending of the printed circuit board by pressing down on the electrical component. In some embodiments, the thermal contact between the additional thermal conductor and the heatsink is made along an xy-dimension. Heat can thus be transferred along the z-dimension from the CPU to the additional thermal conductor and then along the xy-dimension from the additional thermal conductor to the heatsink.

According to some embodiment, a heatsink for an electrical component that reduces the likelihood of incorrect z-placement of the heatsink may include a base thermal conductor, a plurality of fins thermally coupled to the base thermal conductor, an opening in the base thermal conductor, and a hole in the base thermal conductor. The hole may provide fluid access to the opening such that a fluid can be injected between the base thermal conductor and an additional thermal conductor that is in contact with the electrical component being cooled. The additional thermal conductor may be, in some embodiments, a copper disk. The heatsink and additional thermal conductor may be placed on the electrical component to reduce the effects of z-placement manufacturing tolerances when installing the heatsink. The improved heatsink assembly may improve the operation and lifespan of the printed circuit board and electrical component.

The heatsink may be used in an information handling system, such as an Internet of Things (IoT) device or other small form factor device. In some embodiments of the invention, the information handling system may include an electronic component, and a thermal conductor thermally coupled to the electronic component. The thermal conductor may be coupled to a heatsink, such as a heatsink according to the invention or described in embodiments of the invention disclosed herein.

Simulations for heat transfer using embodiments of the cooling system invention described herein show significant reductions in operating temperature of electrical components using the cooling system invention. For example, one simulation involved an 8×6 mm processor die operating with a 15 Watt total dissipated power (TDP) rating thermally coupled through 0.05 mm thick thermal interface material (TIM) with 5 W/mK conduction to a thermal conductor, which is subsequently coupled to the heatsink through a 40 mm diameter, 15 mm thick copper disk. That simulation showed a 1.8 degree Celsius per Watt decrease in operating temperature over a conventional heatsink coupled to the processor through a 1 mm thick thermal pad with 10 W/mK conduction. This would result, for example, in the processor die operating 27 degrees Celsius cooler when using the cooling system invention described herein than when using a conventional heatsink. This lower operating temperature makes the information handling system more efficient and more reliable.

A method for building an information handling system with apparatuses according to embodiments of the invention may include assembling a movable heatsink insert with seals into an opening of a heatsink. Next, a thermal interface material (TIM), such as thermal grease, may be inserted into holes of the heatsink to fill a gap between the heatsink and the thermal conductor. The TIM thermally couples the heatsink and the thermal conductor. After inserting the TIM, plugs may be used to seal the holes and prevent leakage of the TIM. The assembled heatsink assembly, including thermal conductor, may be installed on the electrical component, such as a CPU. During installation of the heatsink, a spring between the thermal conductor and the heatsink may be compressed until the heatsink is attached to the printed circuit board. The spring may moderate downward force applied to the printed circuit board, and thus reduce a possibility of bending the printed circuit board.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The functions performed by the information handling system are carried out using electrical components. Electrical components consume power, which results in the generation of heat which must be dispersed from the electrical components. A thermally-conductive block sometimes referred to as a heatsink is attached to an electrical component transfers heat from electrical component, and the heat can then be transferred away from the thermally-conductive block. In some embodiments of the disclosed invention, thermal contact between the heatsink and the electrical component is provided by an additional thermal conductor separate from the heatsink. This additional thermal conductor can be placed on the electrical component and the heatsink then coupled to that additional thermal conductor. In these embodiments, the heatsink, which is attached to the printed circuit board, is not in direct contact with the electrical component, reducing the likelihood that the heatsink could cause bending of the printed circuit board. One example embodiment of such a heatsink is shown in FIG. 5.

Figure 1:
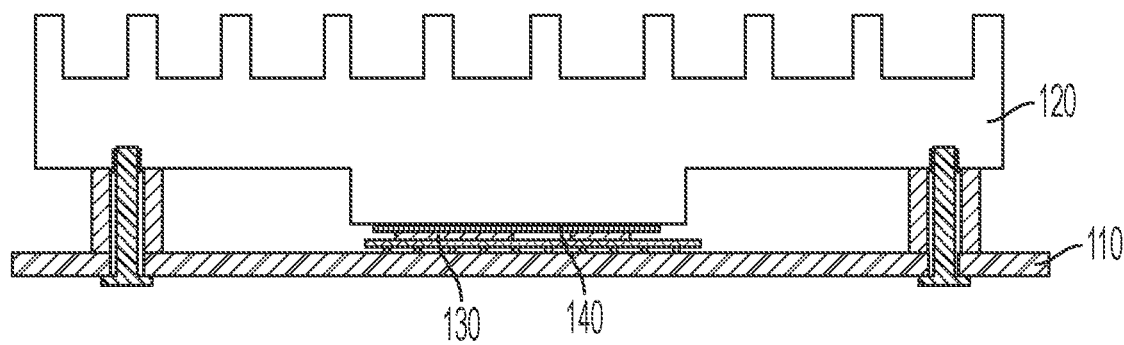
FIG. 1 is a cross-sectional view through a heatsink installation according to the prior art.
Figure 2:
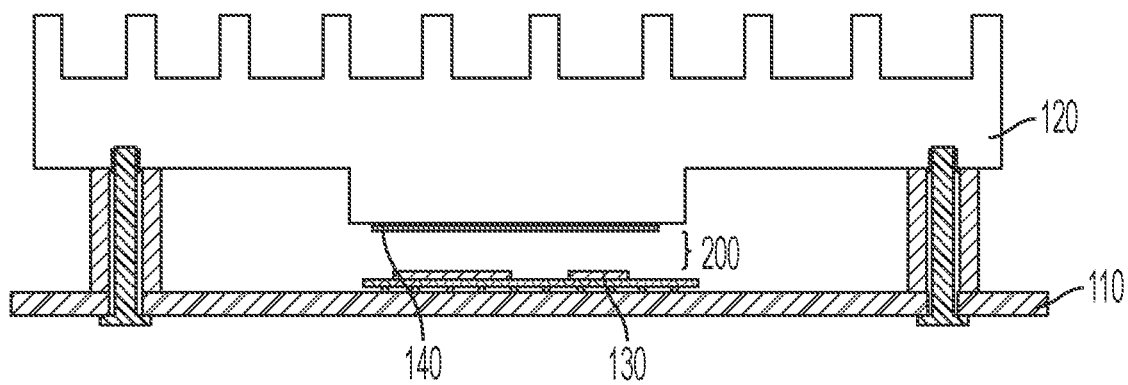
FIG. 2 is a cross-sectional view through a heatsink installation according to the prior art with the heatsink installed too high off a printed circuit board.
Figure 3:
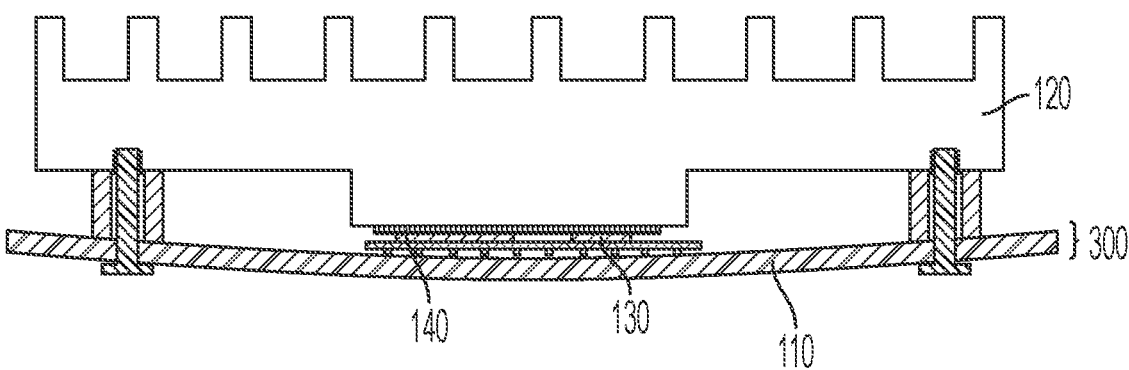
FIG. 3 is a cross-sectional view through a heatsink installation according to the prior art with the heatsink installed too low on a printed circuit board.
Figure 4:
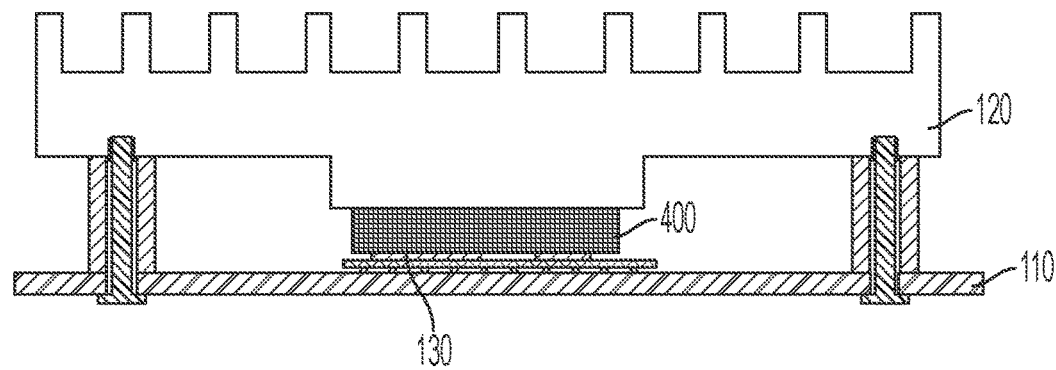
FIG. 4 is a cross-sectional view through a heatsink installation with a thermal pad according to the prior art.
Figure 5:
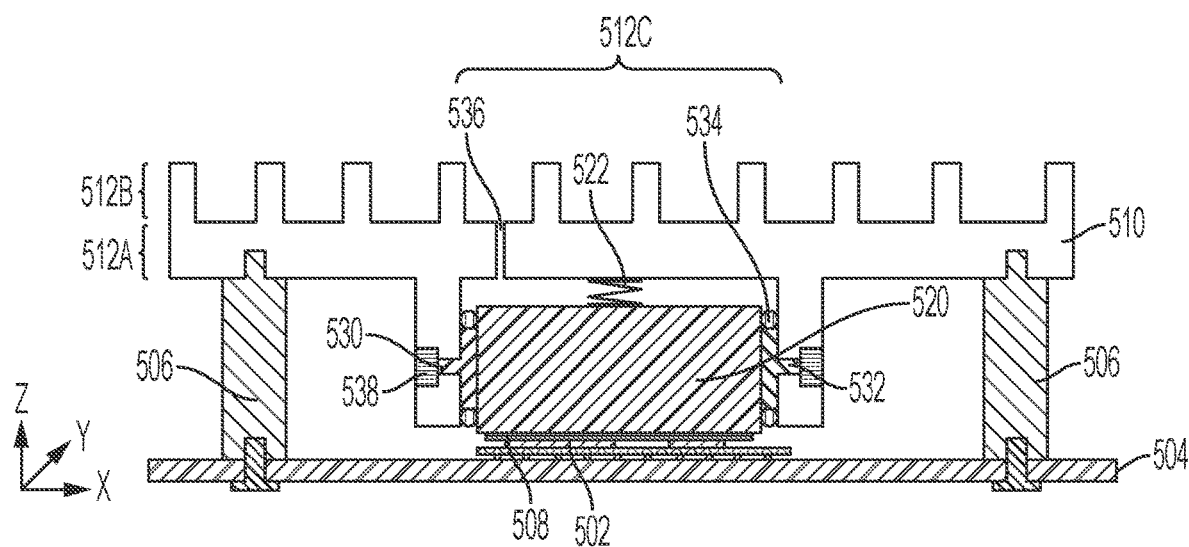
FIG. 5 is a cross-sectional view through a heatsink installation according to embodiments of the disclosure.

FIG. 5 is a cross-sectional view through a heatsink installation according to embodiments of the disclosure. A CPU 502 is attached to a printed circuit board (PCB) 504, such as through pins or balls. A heatsink 510 may be attached to the PCB 504 through one or more standoffs 506. The standoffs 506 may be a plastic or metal component that extends through an opening in the heatsink 510 and attaches the heatsink 510 to the PCB 504. The heatsink 510 may include a base thermal conductor portion 512A, and optionally a plurality of fins 512B. In some embodiments, the fins 512B may be replaced or supplemented with other features such as liquid tube connectors for use as a component in a liquid cooling system.

The heatsink 510 may be located near a movable heatsink insert 520, which may be a copper disk. The insert 520 may fit within an opening 512C of the heatsink 510. A compression spring 522 may be used to secure the conductor 520 within the opening 512C. The insert 520 may be thermally coupled to the CPU 502 through a thermal interface material (TIM) 508, such as grease or a phase change material. One, two, or more holes 530 may be located in the heatsink 510 and provide fluid access to the space in the opening 512C between the insert 520 and the heatsink 510. The holes 530 in the heatsink 510 may extend from the opening 512C through the heatsink 510 to a surface on the heatsink 510 opposite from the opening 512C.

A fluid 532 may be injected through the holes 530 and fill a space in the opening 512C defined by a seal 534, such as an o-ring that contains the fluid 532 inside of a particular space within the opening 512C. In some embodiments an o-ring may not be used when other aspects of the heatsink installation result in containing the fluid 532 to the opening 512C or other desired space. The space between the insert 520 and the heatsink 510 may be as small or smaller than 0.1 mm because manufacturing tolerances in the x-y plane are typically very small. This differs from manufacturing tolerances in the z-dimension where accuracy for placement of standoffs and the heatsink can be 1 mm or greater. Because thermal coupling is made through a spacing between the insert 520 and the heatsink 510, the heatsink assembly can be more easily attached to an information handling system without bending the printed circuit board or losing thermal coupling to the electrical component as may happen with conventional heatsinks described in the background.

A plug 538 may be inserted in the holes 530 after injecting the fluid 532. In some embodiments, a plug may be unnecessary if other aspects of the heatsink installation prevent the fluid 532 from escaping the opening 512C. For example, if the fluid 532 is a low viscosity fluid the plug may not be necessary. As another example, if the spacing between the heatsink 510 and the insert 520 is very small then a plug may not be necessary. The fluid 532 may be a thermally-conductive material that facilities heat transfer from the insert 520 to the heatsink 510, where the heat can be transported away from the CPU 502.

One or more vent holes 536 may be placed in the heatsink 510 to allow escape of air from the opening 512C as the insert 520 is inserted in the opening 512C. The vent holes 536 provide air access to a portion of the opening 512C through the heatsink 510, wherein the portion of the opening 512C is located on a side opposite the seal 534 from an entrance to the opening 512C.

Thermal dissipation from the CPU 502 is provided by a movable heatsink insert 520 separate from the heatsink 510. This movable heatsink insert 520 can be placed on the CPU 502, and the heatsink 510 then attached to that movable heatsink insert 520. In these embodiments, the heatsink 510, which is attached to the printed circuit board 504, is not in direct contact with the CPU 502, reducing the likelihood that the heatsink 510 could cause bending of the printed circuit board 504. The location of the holes 530 relative to the insert 520 during installation of the heatsink assembly in an information handling system does not require high accuracy of z-placement. The heatsink 510 can be placed higher or lower around the insert 520 to contact the standoffs 506 for attachment to the PCB 504 without concern for the thermal conduction or stress on the PCB 504. If the heatsink is pressed lower around the insert 520 to contact the standoffs 506 then the compression spring relieves force from being applied to the CPU 502 that would bend the PCB 504. If the standoffs 506 result in the heatsink 510 being placed high off the PCB 504, the heatsink 510 may still transfer heat from the insert 520 through the TIM 532. Thermal coupling between the heatsink 510 and the CPU 502 is maintained because the insert 520 is resting on the CPU 502 through the TIM 508. Heat transfer and thermal conduction through the heatsink installation is from the CPU 502 through TIM 532 in the z-dimension to the insert 520 and then in the xy-dimension to the heatsink 510 through fluid 532.

Figure 6:
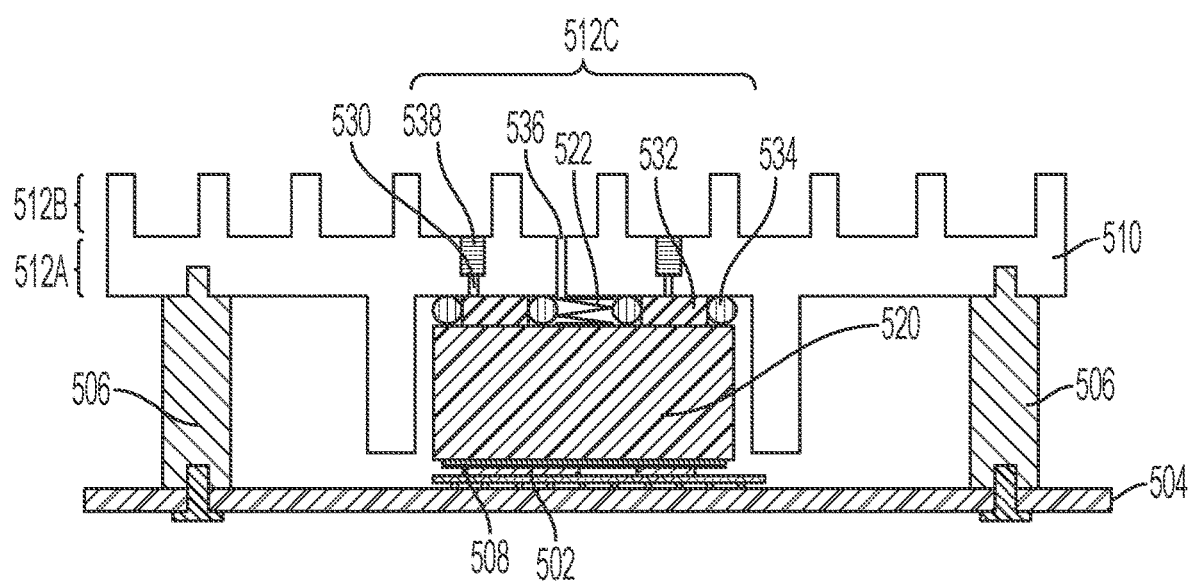
FIG. 6 is a cross-sectional view through a heatsink installation according to other embodiments of the disclosure.

In an alternate arrangement the heat transfer may be through the z-dimension from the insert 520 through fluid 532 to the heatsink 510. One example arrangement is shown in FIG. 6. FIG. 6 is a cross-sectional view through a heatsink installation according to other embodiments of the disclosure. As shown in FIG. 5, the seals 534 are located in a same xy-plane as the compression spring 522 The holes 530 in the heatsink 510 are located on a top-side of the heatsink to provide fluid 532 access to space within the seal 534 in the opening 512C. Many similar benefits are obtained with the configuration of FIG. 6 as the configuration of FIG. 5.

Figure 7:
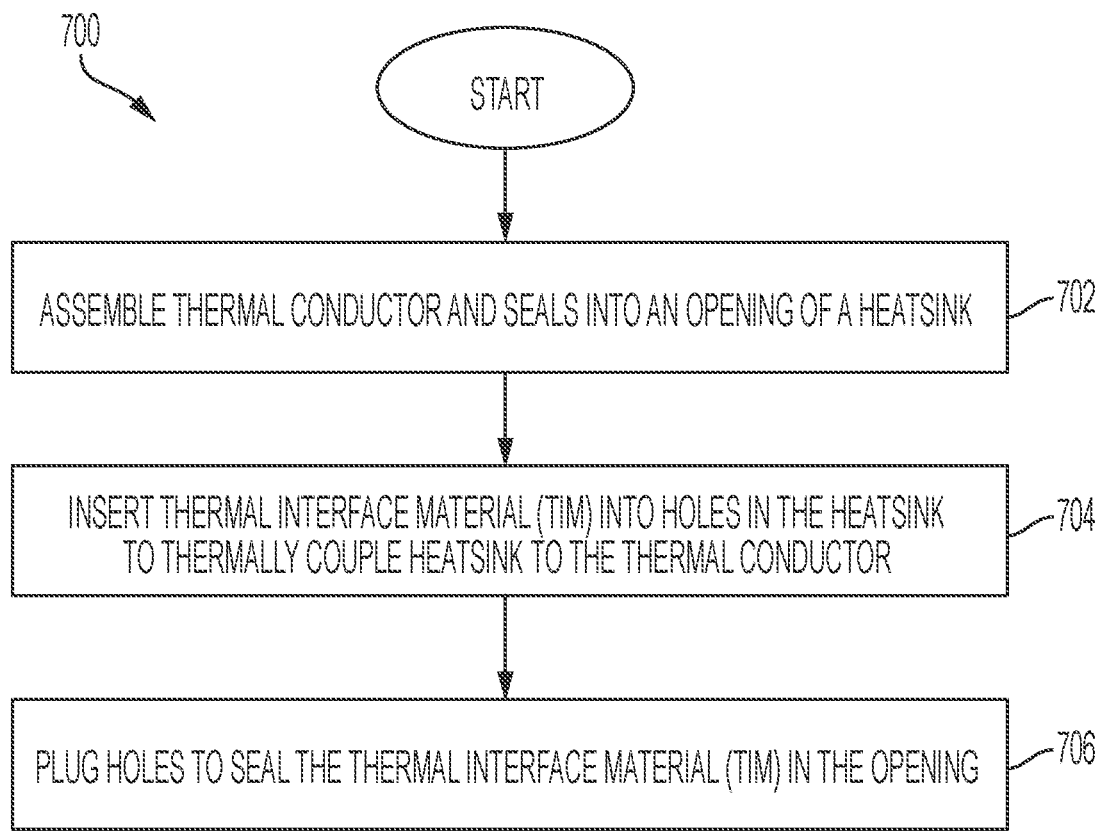
FIG. 7 is a flow chart illustrating a method for installing a heatsink assembly in an information handling system according to embodiments of the disclosure.
Figure 8:
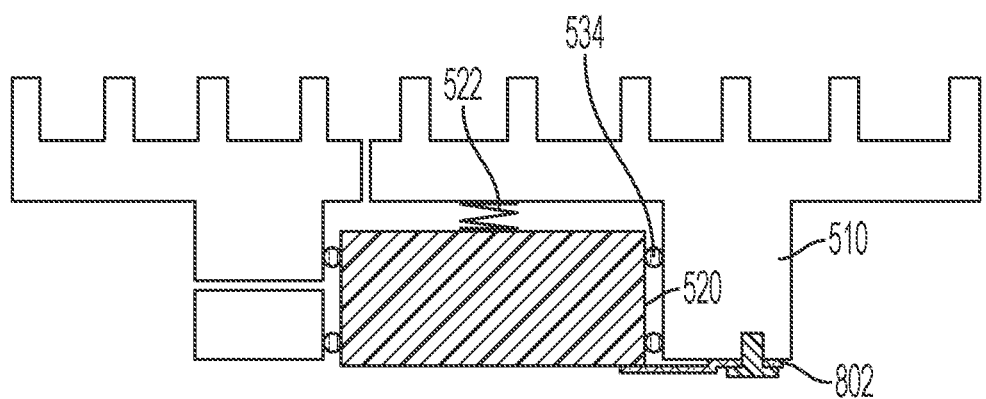
FIG. 8 is a cross-sectional view illustrating a heatsink assembly after attaching of a thermal conductor to a heatsink according to embodiments of the disclosure.

A method for installing the inventive cooling system is shown in FIG. 7. FIG. 7 is a flow chart illustrating a method for installing a heatsink assembly in an information handling system according to embodiments of the disclosure. At block 702, a thermal conductor, such as a copper disk, is assembled with seals and spring into an opening of a heatsink. A clip or other device may be used to contain the thermal conductor within the opening. In other embodiments, the clip may be replaced or supplemented with a shoulder screw inserted from the top of the heatsink through a hole and fastened to the copper disk, which may also keep the spring in position. FIG. 8 is a cross-sectional view illustrating a heatsink assembly after attaching of a thermal conductor to a heatsink with a clip at block 702 according to embodiments of the disclosure. The movable heatsink insert 520 is held in place by clip 802 inside an opening of heatsink 510. The clip 802 may be screwed in to the heatsink 510 and rotate around to lock and release the conductor 520. The spring 522 exerts a force on the insert 520 causing it to press against the clip 802.

Figure 9:
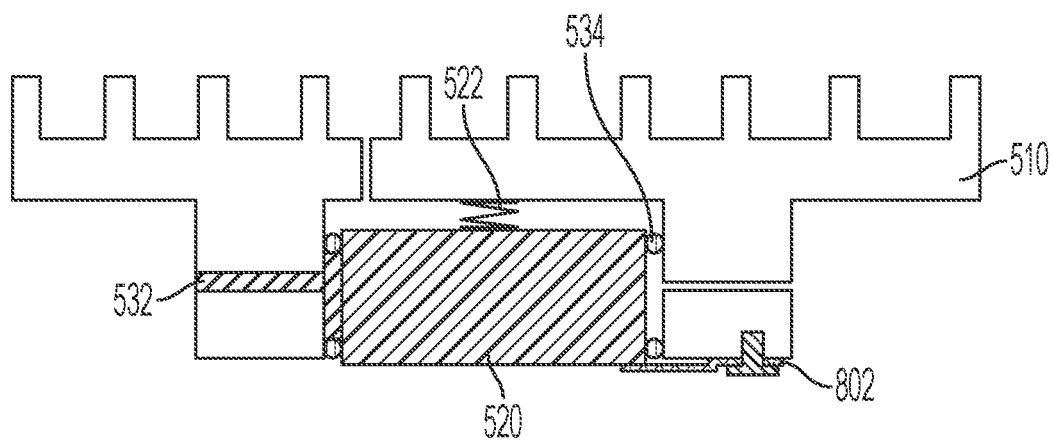
FIG. 9 is a cross-sectional view illustrating a heatsink assembly while injecting a fluid between the thermal conductor and the heatsink according to embodiments of the disclosure.

At block 704, a thermal interface material (TIM), such as a thermally-conductive fluid, is inserted in the holes leading to the opening to thermally couple the heatsink 510 and the insert 520. FIG. 9 is a cross-sectional view illustrating a heatsink assembly while injecting a fluid between the thermal conductor and the heatsink according to embodiments of the disclosure. Fluid 532 is shown being injected into the opening.

Figure 10:
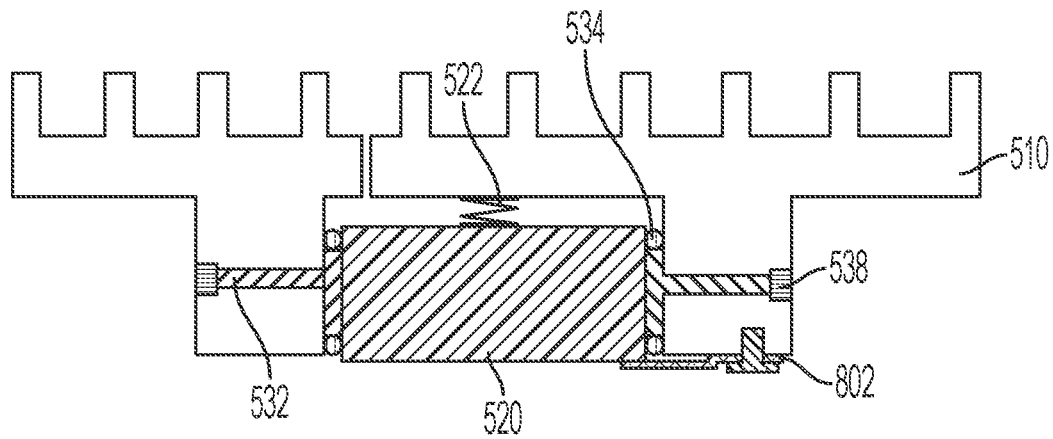
FIG. 10 is a cross-sectional view illustrating a heatsink assembly after injecting a fluid between the thermal conductor and the heatsink according to embodiments of the disclosure.

At block 706, plugs are inserted in the holes to seal the thermally-conductive fluid. FIG. 10 is a cross-sectional view illustrating a heatsink assembly after injecting a fluid between the thermal conductor and the heatsink according to embodiments of the disclosure. Plugs 538 are shown inserted after the fluid 532. The assembled structure of FIG. 10 may then be placed on a CPU or other electrical component and the heatsink secured to a printed circuit board or other physical structure, such as through stand-offs mounted to the PCB or a device enclosure.

Another method for installing a heatsink assembly according to embodiments of the disclosure is described with reference to FIG. 11. A method 1100 may begin at block 1102 with thermally coupling a movable heatsink insert, such as a copper disk, to an electrical component, such as a CPU. The thermal coupling may be achieved by placing the thermal conductor on the CPU. In some embodiments, a thermal interface material (TIM) such as thermal grease may be applied to the CPU before placing the movable heatsink insert on the CPU.

At block 1104, a heatsink is placed over top of the movable heatsink insert placed in block 1102. The heatsink may be configured with an opening that allows at least a portion of the movable heatsink insert to be in contact with the heatsink within the opening. For example, the opening may be configured with a diameter slightly larger than the diameter of the movable heatsink insert, thus allowing a top surface of the movable heatsink insert to fit within the opening. The opening in the heatsink may be a fraction of a height of the movable heatsink insert, such that only a portion of the movable heatsink insert fits within the heatsink. Alternatively, the opening height may be equal or slightly larger in height than the movable heatsink insert such that the movable heatsink insert is enclosed by the heatsink on all sides except a bottom side in contact with the CPU.

At block 1106, a thermal interface material (TIM) is insert through a hole in the heatsink into a portion of the opening of the heatsink. The inserted TIM contacts the movable heatsink insert and the heatsink within the opening of the heatsink and provide thermal coupling for heat transfer from the thermal conductor to the heatsink. In some embodiments, the TIM may also mechanically secure the movable heatsink insert within the heatsink. In some embodiments, the opening or the movable heatsink insert may include an o-ring seal that creates a defined space between the movable heatsink insert and the heatsink for receiving the TIM. After the TIM is inserted through the hole, the hole can be plugged. For example, if the TIM remains viscous after insertion a plug can be inserted to prevent the TIM from leaking out. In some embodiments, the TIM may dry in place within the hole effectively plugging the hole.

Figure 11:
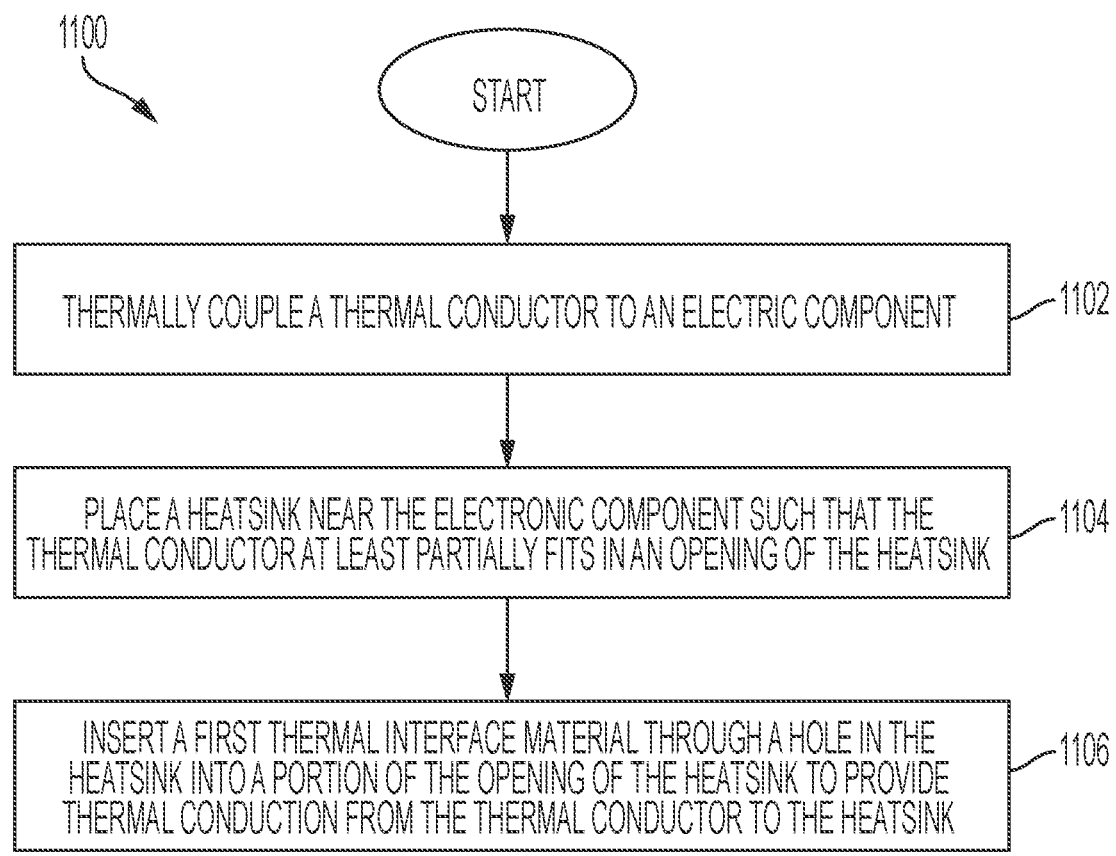
FIG. 11 is a flow chart illustrating a method for installing a heatsink assembly in an information handling system according to embodiments of the disclosure.

The schematic flow chart diagrams of FIG. 7 and FIG. 11 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although processors are described throughout the detailed description as one example electrical component, aspects of the invention may be applied to the design of or implemented on different other processor electrical components, such as graphics processing units (GPUs), central processing units (CPUs), and digital signal processors (DSPs). As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
 a heatsink comprising:
  an opening configured to receive a movable heatsink insert;
  a hole in the heatsink extending from the opening through the heatsink to a first surface on the heatsink opposite from the opening; and
  a seal coupled to the heatsink within the opening, wherein the seal is configured to form an enclosed space in the opening at an exit of the hole for containing a fluid between the movable heatsink insert and the heatsink, wherein the enclosed space is defined by the seal, the removable heatsink insert, and a second surface on the heatsink facing the movable heatsink insert.

2. The apparatus of claim 1, further comprising a compression spring attached to the heatsink in the opening.

3. The apparatus of claim 1, further comprising second openings in the heatsink configured to receive stand-offs for attaching the heatsink to another component of an information handling system.

4. The apparatus of claim 1, wherein the seal comprises an o-ring.

5. The apparatus of claim 1, further comprising a second hole in the heatsink, wherein the second hole provides air access to a portion of the opening through the heatsink, wherein the portion of the opening is located on a side opposite the seal from an entrance to the opening.

6. The apparatus of claim 1, further comprising a clip attached to the heatsink and configured to secure the movable heatsink insert within the opening.

7. An information handling system, comprising:
an electronic component;
a movable heatsink insert thermally coupled to the electronic component; and
a heatsink comprising:
an opening configured to receive the movable heatsink insert;
at least one hole in the base, wherein the at least one hole extends from the opening through the heatsink to a first surface on the heatsink opposite from the opening; and
a seal coupled to the heatsink within the opening, wherein the seal forms an enclosed space in the opening at an exit of the at least one hole for containing a fluid between the movable heatsink insert and the heatsink, wherein the enclosed space is defined by the seal, the removable heatsink insert, and a second surface on the heatsink facing the movable heatsink insert.

8. The information handling system of claim 7, wherein the movable heatsink insert comprises a copper disk.

9. The information handling system of claim 7, further comprising a compression spring attached to the heatsink in the opening.

10. The information handling system of claim 7, further comprising second openings in the heatsink configured to receive stand-offs for attaching the heatsink to another component of an information handling system.

11. The information handling system of claim 7, further comprising a thermal interface material (TIM) in the at least one hole that is thermally coupled to the heatsink and to the movable heatsink insert to allow transfer of heat from the movable heatsink insert to the heatsink.

12. The information handling system of claim 7, wherein the seal comprises an o-ring.

13. The information handling system of claim 7, further comprising a second hole in the heatsink, wherein the second hole provides air access to a portion of the opening through the heatsink, wherein the portion of the opening is located on a side opposite the seal from an entrance to the opening.

14. The information handling system of claim 7, further comprising a clip attached to the heatsink and configured to secure the movable heatsink insert within the opening.

15. The information handling system of claim 7, wherein the information handling system comprises an Internet of Things (IoT) device.

* * * * *